(12) United States Patent
Takemori et al.

(10) Patent No.: US 12,028,984 B2
(45) Date of Patent: Jul. 2, 2024

(54) DOUBLE-SIDED CIRCUIT NON-OXIDE-BASED CERAMIC SUBSTRATE AND METHOD FOR MANUFACTURING SAME

(71) Applicant: Hitachi Power Solutions Co., Ltd., Hitachi (JP)

(72) Inventors: Hideaki Takemori, Ibaraki (JP); Satoshi Higashiyama, Ibaraki (JP); Toru Itagaki, Ibaraki (JP)

(73) Assignee: Hitachi Power Solutions Co., Ltd., Hitachi (JP)

( * ) Notice: Subject to any disclaimer, the term of this patent is extended or adjusted under 35 U.S.C. 154(b) by 251 days.

(21) Appl. No.: 17/727,026

(22) Filed: Apr. 22, 2022

(65) Prior Publication Data

US 2022/0248537 A1 Aug. 4, 2022

Related U.S. Application Data

(62) Division of application No. 16/502,291, filed on Jul. 3, 2019, now abandoned.

(30) Foreign Application Priority Data

Jul. 17, 2018 (JP) .................. 2018-134431

(51) Int. Cl.
*H05K 3/00* (2006.01)
*H05K 1/03* (2006.01)
(Continued)

(52) U.S. Cl.
CPC ......... *H05K 3/0094* (2013.01); *H05K 1/0306* (2013.01); *H05K 3/4076* (2013.01); *H05K 3/4688* (2013.01)

(58) Field of Classification Search
CPC .. H05K 3/0094; H05K 1/0306; H05K 3/4076; H05K 3/4688
See application file for complete search history.

(56) References Cited

U.S. PATENT DOCUMENTS 4,131,516 A 12/1978 Bakos et al.
10,770,698 B1 9/2020 Seitz et al.
(Continued)

FOREIGN PATENT DOCUMENTS

CN 103228102 A 7/2013
CN 103889168 A 6/2014
(Continued)

OTHER PUBLICATIONS

Chinese-language Office Action issued in Chinese Application No. 201910596647.8 dated Jun. 30, 2022 with English translation (14 pages).

(Continued)

*Primary Examiner* — Scott Bauer
(74) *Attorney, Agent, or Firm* — Crowell & Moring LLP

(57) ABSTRACT

The object of the invention is to provide a double-sided circuit non-oxide-based ceramic substrate excellent in radiation property and low in cost, and a method for manufacturing the same. A double-sided circuit non-oxide-based ceramic substrate related to the present invention includes a high heat-conductive non-oxide-based ceramic substrate that includes a through hole, a holding layer that is formed on a wall surface of the through hole, and an electro-conductive metal section that is held inside the through hole by the holding layer and does not include an active metal. The double-sided circuit non-oxide-based ceramic substrate related to the present invention preferably includes electrodes (thin film electrodes) that shield end surfaces of the holding layer and end surfaces of the electro-conductive (Continued)

metal section which are exposed to front and back surfaces of the ceramic substrate.

3 Claims, 4 Drawing Sheets

(51) Int. Cl.
*H05K 3/40* (2006.01)
*H05K 3/46* (2006.01)

(56) References Cited

U.S. PATENT DOCUMENTS

| | | |
|---|---|---|
| 2001/0020549 A1 | 9/2001 | Horiuchi et al. |
| 2005/0012217 A1* | 1/2005 | Mori ................ H01L 23/49822 257/E23.062 |
| 2005/0029014 A1 | 2/2005 | Miura |
| 2007/0138710 A1 | 6/2007 | Fukuyama et al. |
| 2007/0184654 A1 | 8/2007 | Akram et al. |
| 2013/0146340 A1 | 6/2013 | Takahashi et al. |
| 2013/0186675 A1 | 7/2013 | Takahashi et al. |
| 2016/0262271 A1* | 9/2016 | Nazarenko ........... H05K 1/0306 |
| 2017/0053872 A1* | 2/2017 | Lee ................... H01L 21/76879 |
| 2018/0005918 A1 | 1/2018 | Naba et al. |
| 2018/0068949 A1* | 3/2018 | Chen ................ H01L 21/76877 |

FOREIGN PATENT DOCUMENTS

| | | |
|---|---|---|
| CN | 106003892 A | 10/2016 |
| JP | 2005-101178 A | 4/2005 |
| JP | 2006-319314 A | 11/2006 |
| JP | 2010-27637 A | 2/2010 |
| JP | 2012-129238 A | 7/2012 |
| JP | 2015-185820 A | 10/2015 |
| JP | 2017-130596 A | 7/2017 |
| TW | 201637143 A | 10/2016 |
| WO | WO 2011/125874 A1 | 10/2011 |

OTHER PUBLICATIONS

United States Final Office Action issued in U.S. Appl. No. 16/502,291 dated Aug. 19, 2022 (12 pages).

United States Non-Final Office Action issued in U.S. Appl. No. 16/502,291 dated Nov. 1, 2021 (11 pages).

Chinese-language Office Action issued in Chinese Application No. 201910596647.8 dated Jan. 4, 2022 with English translation (15 pages).

Chinese-language Office Action issued in Chinese Application No. 201910596647.8 dated Oct. 11, 2022 with English translation (14 pages).

* cited by examiner

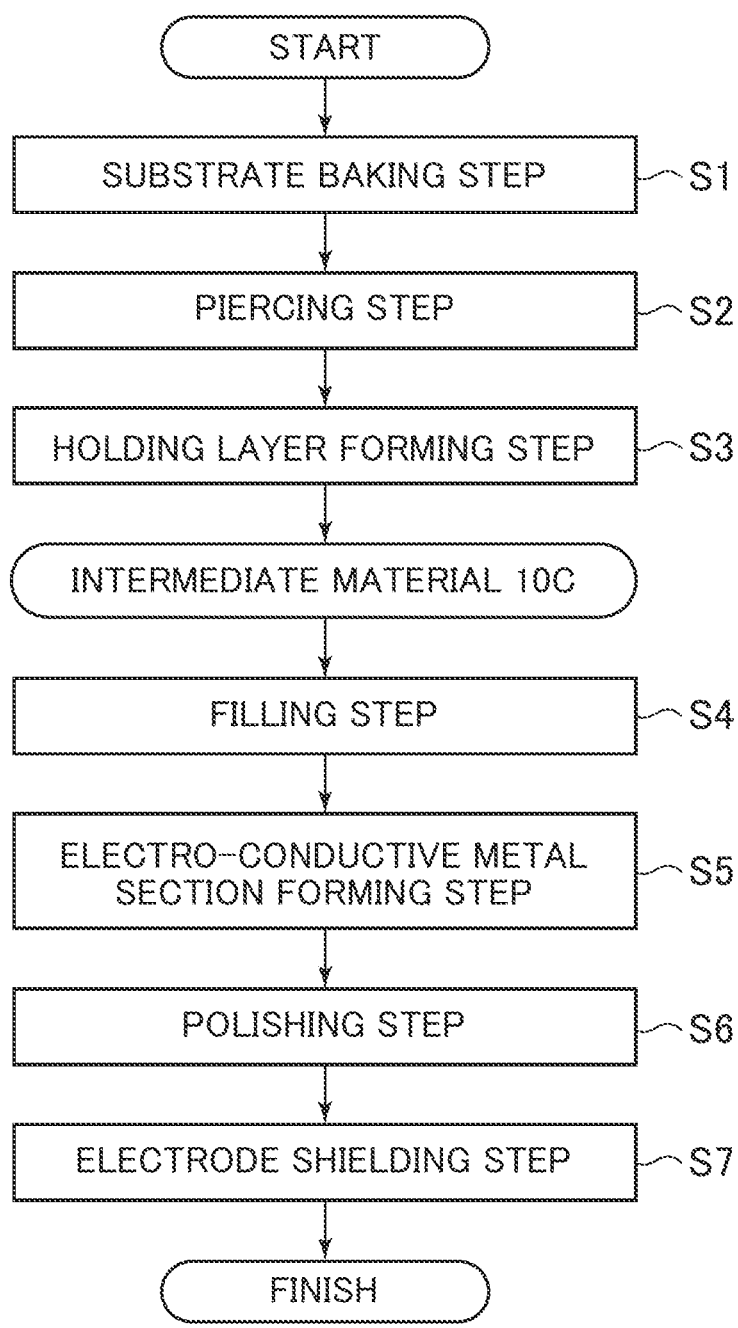

DOUBLE-SIDED CIRCUIT NON-OXIDE-BASED CERAMIC SUBSTRATE AND METHOD FOR MANUFACTURING SAME

CROSS REFERENCE TO RELATED APPLICATIONS

This application is a divisional of U.S. patent application Ser. No. 16/502,291, filed Jul. 3, 2019, which claims priority under 35 U.S.C. § 119 from Japanese Patent Application No. 2018-134431, filed Jul. 17, 2018, the entire disclosures of which are herein expressly incorporated by reference.

TECHNICAL FIELD

The present invention relates to a double-sided circuit non-oxide-based ceramic substrate and a method for manufacturing the same.

BACKGROUND ART

In Patent Literature 1, there is described a method for manufacturing a ceramic via substrate that includes an electro-conductive via in a through hole of a ceramic sintered compact substrate, the through hole being for electrical conduction, the electro-conductive via being obtained by closest-packing electro-conductive metal paste in the through hole, the metal paste including a metal having a melting point of 600° C. or above and 1,100° C. or below, a metal having a melting point higher than that of the said metal, and an active metal (titanium). In the method, an active layer is formed in the interface between the electro-conductive via and the ceramic sintered compact substrate.

CITATION LIST

Patent Literature

Patent Literature 1: Japanese Unexamined Patent Application Publication No. 2012-129238

SUMMARY OF INVENTION

Technical Problem

High power laser devices have been used for the usage of healthcare, machining, wavelength conversion, and the like for example. The laser output of the high power laser device has risen year by year, and the heat generation amount has been increasing accompanying it. Therefore, with respect to the ceramic substrate used for the high power laser device, high heat radiation performance is required.

Also, according to the manufacturing method described in Patent Literature 1, because the electro-conductive metal paste including an active metal (titanium) is used as described above, it is required to execute baking under a vacuum environment by using a high vacuum furnace and so on in constructing the electro-conductive via. Therefore, it is concerned that the cost increases in the manufacturing method described in Patent Literature 1.

The present invention has been achieved in view of the circumstances described above, and its object is to provide a double-sided circuit non-oxide-based ceramic substrate excellent in heat radiation performance and low in cost, and a method for manufacturing the same.

Solution to Problem

The double-sided circuit non-oxide-based ceramic substrate related to the present invention includes a high heat-conductive non-oxide-based ceramic substrate, a holding layer, and an electro-conductive metal section. The ceramic substrate includes a through hole, the holding layer is formed on a wall surface of the through hole by oxide of silicon or alumina, and the electro-conductive metal section is held inside the through hole by the holding layer and does not include an active metal.

Advantageous Effects of Invention

According to the present invention, it is possible to provide a double-sided circuit non-oxide-based ceramic substrate excellent in heat radiation performance and low in cost, and a method for manufacturing the same.

Problems, configurations (means), and effects other than those described above will be clarified by explanation of embodiments described below.

BRIEF DESCRIPTION OF DRAWINGS

FIG. 2 is a flowchart that explains contents of a method for manufacturing the double-sided circuit non-oxide-based ceramic substrate related to the present embodiment.

DESCRIPTION OF EMBODIMENTS

Figure 1:
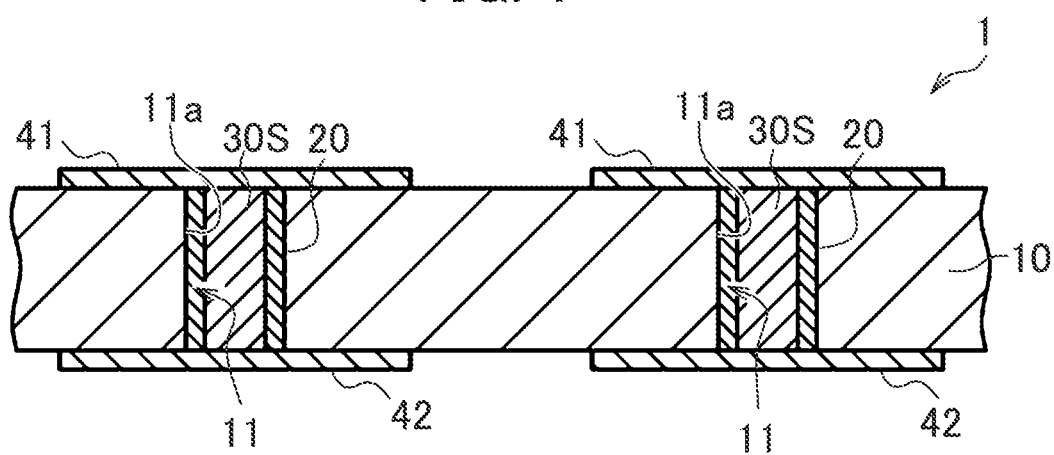
FIG. 1 is a cross-sectional view that shows a double-sided circuit non-oxide-based ceramic substrate related to the present embodiment.

Below, embodiments of the present invention will be explained in detail referring to the drawings. Also, in each drawing, common constituent elements will be marked with a same reference sign, and duplicated explanation will be omitted. Further, there is a case that the size and the shape of a member may be modified or exaggerated to be expressed schematically for the sake of convenience of explanation.

FIG. 1 is a cross-sectional view that shows a double-sided circuit non-oxide-based ceramic substrate (may be hereinafter described simply as "double-sided circuit substrate" in the present description) related to the present embodiment. A double-sided circuit substrate 1 related to the present embodiment shown in FIG. 1 is applied to an integrated circuit that is mounted on a high power laser device for the usage of healthcare, machining, wavelength conversion, and the like for example. Also, in the present embodiment, a high power laser device means one having the laser output of 1 W or more for example.

As shown in FIG. 1, the double-sided circuit substrate 1 includes a high heat-conductive non-oxide-based ceramic substrate (may be hereinafter described simply as "high heat-conductive substrate in the present description) 10, a holding layer 20, and an electro-conductive metal section 30S, the ceramic substrate 10 including a through hole 11 that is for electrical conduction, the holding layer 20 being formed on a wall surface 11a of the through hole 11, the electro-conductive metal section 30S being held inside the through hole 11 by the holding layer 20, being arranged so as to fill the entirety of the through hole 11, and not including an active metal. Also, with respect to the double-sided circuit substrate 1, both ends of the through hole 11 are exposed to the surfaces (the front surface and the back surface) of the high heat-conductive substrate 10 and are shielded by electrodes (thin film electrodes 41 and 42). Also, with regard to "not including an active metal", although it is ideal not to include an active metal (the content is 0 mass %), an active metal may be contained if the content is in a degree of inevitable impurities. Here, inevitable impurities mean impurities that exist in the raw material or are inevitably mixed in the manufacturing process in the electro-conductive metal section 30S, are essentially unnecessary, but are permitted because they are in a minute quantity and do not adversely affect the property of the electro-conductive metal section 30S. As the upper limit of the content (allowable quantity of an active metal) of a degree of inevitable impurities, 0.05 mass % can be cited for example. As an active metal, titanium, chromium, and the like can be cited for example.

The high heat-conductive substrate 10 is one that becomes a base of the double-sided circuit substrate 1, and is formed using non-oxide-based ceramic material. Such non-oxide-based ceramic material ("high heat-conductive non-oxide-based ceramic substrate" referred to in claims) forming the high heat-conductive substrate 10 can be formed using at least one kind selected from a group consisting of aluminum nitride (AlN), silicon nitride (SiN), silicon carbide (SiC), and diamond for example. Particularly, in the present embodiment, it is preferable to be the high heat-conductive substrate 10 that is formed using AlN, SiC, diamond, and the like because the heat conductivity is high and the mechanical strength and the insulation performance are also high. Here, the heat conductivity of the high heat-conductive substrate 10 is preferable to be 80 W/(m·K) or more, is more preferable to be 100 W/(m·K) or more, is further more preferable to be 140 W/(m·K) or more, is still more preferable to be 250 W/(m·K) or more, and is most preferable to be 1,000 W/(m·K) or more. By doing so, the heat radiation performance of the double-sided circuit substrate 1 becomes surely excellent. On the other hand, when the substrate is formed using oxide-based ceramic material, because the heat conductivity is low, the substrate is inferior in the heat radiation performance.

Also, with respect the method for manufacturing the high heat-conductive substrate 10, generally known manufacturing method for a sintered compact can be used. For example, in the case of the high heat-conductive substrate 10 made of AlN, raw material powder whose main component is AlN powder is mixed by a wet process, is thereafter added with a binder, and is mixed and dried to obtain granulated powder. Thereafter, the granulated powder is formed into a compact by a known press forming method, a CIP (Cold Isostatic Pressing) forming method, or a known forming method such as a doctor blade method that is suitable to form a sheet, an extrusion forming method, and an injection molding method. Thereafter, by subjecting the compact to degreasing of the forming binder and baking, the high heat-conductive substrate 10 can be obtained (refer to the substrate baking step S1 described below).

Also, the high heat-conductive substrate 10 includes the through holes 11 that penetrate a sheet-like member of the high heat-conductive substrate 10 from one surface side (the front surface side) to the other surface side (the back surface side). Further, the number of forming the through holes 11 is not limited to the number shown in FIG. 1 (2 positions), and may be 1 position or 3 positions or more. For example, when the high heat-conductive substrate 10 is applied to an integrated circuit of a high power laser device, the through holes 11 having the diameter of approximately 0.1 mm are formed.

The holding layer 20 is formed on the wall surface (the peripheral wall surface, the inner wall surface) 11a of the through hole 11. Also, it is preferable that the holding layer 20 is formed on the entire wall surface 11a of the through hole 11 so that one end in the axial direction of the through hole 11 extends to one surface side (the front surface side 10a) of the high heat-conductive substrate 10 and that the other end in the axial direction of the through hole 11 extends to the other surface side (the back surface side 10b) of the high heat-conductive substrate 10. Further, the holding layer 20 is formed so as to closely adhere to the wall surface 11a of the through hole 11.

Also, it is preferable to form the holding layer 20 using oxide of silicon for example. In concrete terms, it is preferable to form the holding layer 20 using silicon dioxide ($SiO_2$). Thus, the wall surface 11a of the through hole 11 becomes in an oxygen-rich state, and the bonding force of the holding layer 20 and the electro-conductive metal section 30S can be enhanced. Also, the holding layer 20 can be formed by optional material as far as the holding layer 20 can be formed so as to closely adhere to the wall surface 11a of the through hole 11 and the oxygen-rich state that allows to join with the electro-conductive metal section 30S can be formed on the surface. From such viewpoint, the holding layer 20 can be formed using oxide of aluminum for example, or, to be more specific, alumina ($Al_2O_3$).

The electro-conductive metal section 30S is obtained by baking an electro-conductive metal paste 30 (refer to FIG. 3D, FIG. 4D) that contains tin (Sn) for example. As the electro-conductive metal paste 30, it is possible to use a paste including an Ag—Sn-based alloy having the main component of silver (Ag) and containing Sn, a paste including a Cu—Sn-based alloy having the main component of copper (Cu) and containing Sn, and so on. In terms of the electro-conductivity, a paste including Ag and Cu is preferable. When the electro-conductive metal paste 30 is a paste including an Ag—Sn-based alloy for example, it is preferable to use one with 90 mass % of Ag and 3-8 mass % of Sn. Also, the electro-conductive metal paste 30 is not limited to those described above, and can also use an alloy that contains at least one of Au, Ag, and Cu and Sn of a paste including an Au—Sn-based alloy, a paste including an Ag—Cu—Sn-based alloy, and so on. Further, the electro-conductive metal paste 30 does not include an active metal such as titanium and chromium in order to prevent oxidation at the time of baking.

As described above, with respect to the double-sided circuit substrate 1, both ends of the holding layer 20 and both ends of the electro-conductive metal section 30S formed on the wall surface 11a of the through hole 11 are exposed to the surfaces (the front surface and the back surface) of the high heat-conductive substrate 10 and are shielded by the electrodes (the thin film electrodes 41 and 42). Also, the thin film electrodes 41 and 42 are arranged so as to be in contact with the electro-conductive metal section 30S. Further, the surface of the high heat-conductive substrate 10, the both ends of the holing layer 20, and both end surfaces of the electro-conductive metal section 30S are formed so as to be flush with each other, and are configured to form a flat surface (a smooth surface). Thus, it is easy to overlay the thin film electrodes 41 and 42 so as to be in contact with the electro-conductive metal section 30S on the surface of the high heat-conductive substrate 10, and to form a circuit pattern.

Also, the thin film electrodes 41 and 42 are formed of 3 layers of a titanium thin film, a platinum thin film, and a gold thin film for example. Further, the thin film electrodes 41 and 42 are not limited to have 3 layers, and may have 2 layers or less, or 4 layers or more. The thin film electrodes 41 and 42 can be formed to have the thickness of 0.1 to 5 μm for example. However, the present embodiment is not limited to it, and it is also possible to employ electrodes thicker than the thin film electrodes 41 and 42 (the thickness of 5 to 100 μm for example).

As described above, the double-sided circuit substrate 1 related to the present embodiment includes the high heat-conductive substrate 10, the holing layer 20, and the electro-conductive metal section 30S, the high heat-conductive substrate 10 including the through hole 11, the holing layer 20 being formed on the wall surface 11a of the through hole 11, the electro-conductive metal section 30S being held inside the through hole 11 by the holding layer 20 and not including an active metal. Thus, with respect to the double-sided circuit substrate 1, because the holing layer 20 is formed on the wall surface 11a of the through hole 11, when the through hole 11 is filled with the electro-conductive metal paste 30 and baking is performed, the electro-conductive metal section 30S and the high heat-conductive substrate 10 can be bonded to each other. Also, with respect to the double-sided circuit substrate 1 related to the present embodiment, because the electro-conductive metal paste 30 does not include an active metal, baking under a high vacuum environment using a high vacuum furnace and so on is not required, and manufacturing is possible at a low cost (this point will be described below).

Next, a method for manufacturing a double-sided circuit substrate related to the present embodiment will be explained.

FIG. 2 is a flowchart that explains contents of a method for manufacturing the double-sided circuit substrate related to the present embodiment. FIGS. 3A to 3G are process drawings that show an aspect of the method for manufacturing the double-sided circuit substrate related to the present embodiment. FIGS. 4A to 4G are process drawings that show another aspect of the method for manufacturing the double-sided circuit substrate related to the present embodiment.

As shown in FIG. 2, the present manufacturing method includes a substrate baking step S1, a piercing step S2, and a holding layer forming step S3. By executing the steps up to here in this order, it is possible to manufacture the double-sided circuit substrate 1 related to an intermediate material 10C (refer to FIG. 3C and FIG. 4C) described below.

Also, continuing to the holding layer forming step S3 described above, the present manufacturing method includes a filling step S4, an electro-conductive metal section forming step S5, and a polishing step S6. By executing the steps up to here in this order, it is possible to manufacture the double-sided circuit substrate 1 of a stage before forming electrodes.

Also, continuing to the polishing step S6 described above, the present manufacturing method includes an electrode shielding step S7. By executing this step, it is possible to manufacture the double-sided circuit substrate 1 that is formed with the electrodes.

Here, with respect to the aspect of piercing by the piercing step S2, because the contents up to completion of the double-sided circuit substrate 1 differs to some extent according to whether the high heat-conductive substrate 10 has the penetrated through holes 11 (refer to FIGS. 3A to 3G) or the non-penetrated through holes 11 (non-penetrated holes 12, refer to FIGS. 4A to 4G), explanation will be made individually referring to FIGS. 3A to 3G and FIGS. 4A to 4G.

First, an aspect of piercing by the piercing step S2 will be explained for a case of the penetrated through holes 11 referring to FIGS. 3A to 3G.

In the process drawings of FIGS. 3A to 3G, the process is executed in the order of 3A→3B→3C→3D→3E→3F→3G. Also, explanation will be hereinafter made with the definition that the upper side in the drawing of the high heat-conductive substrate 10 as the front side and the lower side in the drawing as the back side.

Figure 3A:
FIGS. 3A to 3G are process drawings that show an aspect of the method for manufacturing the double-sided circuit non-oxide-based ceramic substrate related to the present embodiment.

FIG. 3A shows the substrate baking step S1 that is shown in FIG. 2. In the substrate baking step S1, non-oxide-based ceramic material formed into a sheet shape is baked, and the high heat-conductive substrate 10 is manufactured. This high heat-conductive substrate 10 is in a state before forming the through holes 11. With respect to the non-oxide-based ceramic material, one described above can be used, and the non-oxide-based ceramic material can be formed into a sheet shape by a general method. The sheet thickness of the high heat-conductive substrate 10 may be approximately 0.5 mm for example.

Figure 3B:
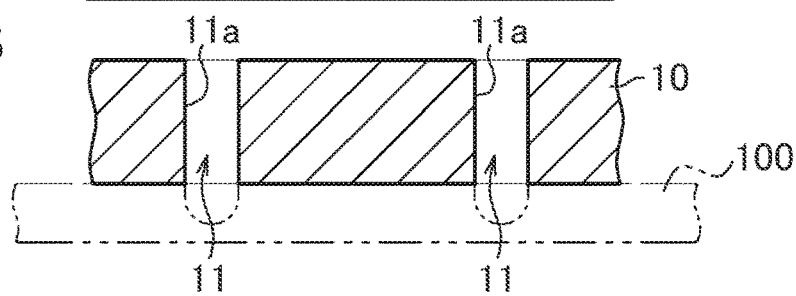

FIG. 3B shows the piercing step S2 that is shown in FIG. 2. In this piercing step S2, predetermined positions of the high heat-conductive substrate 10 are pierced, and the penetrated through holes 11 are formed. The through holes 11 shown in FIG. 3B are formed by laser machining or blast machining. In the laser machining, the diameter of the through hole 11 can be made smaller compared to the blast machining. Also, in the laser machining, the diameter of the through hole 11 can be made equal from the front surface to the back surface of the high heat-conductive substrate 10. With respect to the blast machining, shot blast, sand blast, and the like can be applied. Also, a dummy sheet (fitting plate) 100 in FIG. 3B is a sheet that is fitted to the back surface of the high heat-conductive substrate 10 which is on the opposite side of the laser irradiation side in the laser machining.

Figure 3C:
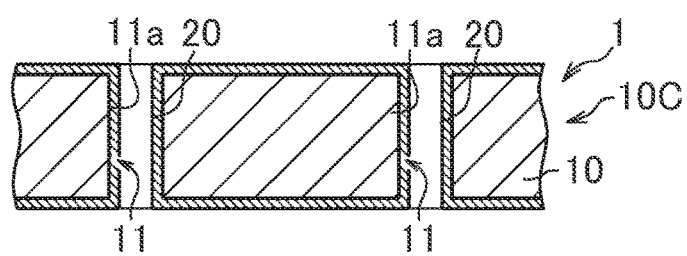

FIG. 3C shows the holding layer forming step S3 that is shown in FIG. 2. In the holding layer forming step S3, the holding layer 20 is formed at least on the wall surface 11a of the through hole 11. By executing this holding layer forming step S3, the double-sided circuit substrate 1 related to intermediate material 10C can be manufactured. Although it is preferable to form the holding layer 20 using oxide of silicon as described above, the holding layer 20 can be formed also using oxide of aluminum and so on.

As the method for forming the holding layer 20 on the wall surface 11a, a known gas-phase process such as sputtering, CVD (Chemical Vapor Deposition), ion plating, and the like for example can be applied. Also, the film thickness of the holding layer 20 is not particularly limited, and only has to be of such degree that oxygen is attached to the wall surface 11a, namely approximately 1 μm for example.

Further, by performing sputtering, CVD, ion plating, and the like from the both surfaces (the front surface and the back surface) of the high heat-conductive substrate 10, the holding layer 20 can be formed on the entire wall surface 11a of the through hole 11. Also, in FIGS. 3A to 3G, such aspect is shown that the holding layer 20 is formed by sputtering, CVD, ion plating, and the like not only on the wall surface 11a but also in a position other than the through hole 11 of the high heat-conductive substrate 10.

Figure 3D:
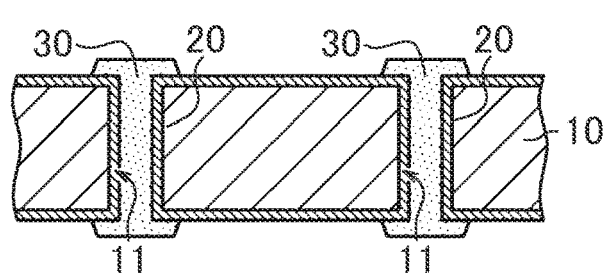

FIG. 3D shows the filling step S4 that is shown in FIG. 2. In the filling step S4, the through hole 11 where the holding layer 20 is formed in the holding layer forming step S3 is filled with the electro-conductive metal paste 30. As a method for filling the through hole 11 with the electro-conductive metal paste 30, it is possible to apply a general method such as a screen printing method for example. Also, when the diameter of the through hole 11 is small, the viscosity of the electro-conductive metal paste 30 is high, and it is hard to fill the through hole 11 with the electro-conductive metal paste 30, at the time of screen printing, a mesh-shape sheet material is fitted to the opposite side of the side for printing the through hole 11, the electro-conductive metal paste 30 is sucked by a suction device through the mesh-shape sheet material, and thereby the electro-conductive metal paste 30 can be filled to the entire hole from one end to the other end in the axial direction of the through hole 11. Further, by printing the electro-conductive metal paste 30, filling is executed in a state the electro-conductive metal paste 30 slightly protrudes from the through hole 11.

Figure 3E:
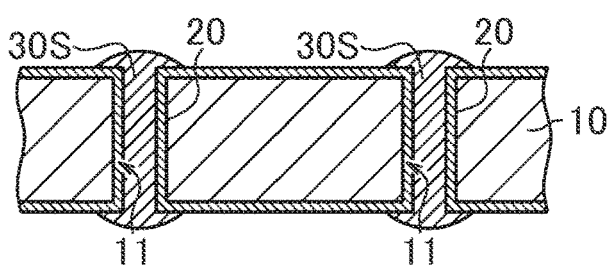

FIG. 3E shows the electro-conductive metal section forming step S5 that is shown in FIG. 2. In the electro-conductive metal section forming step S5, the high heat-conductive substrate 10 after the filling step S4 is baked, and the electro-conductive metal paste 30 is made the electro-conductive metal section 30S. Baking of the high heat-conductive substrate 10 is executed under an atmospheric environment using a reflow furnace for example. In the reflow furnace, when the high heat-conductive substrate 10 shown in FIG. 3D is charged, the high heat-conductive substrate 10 is discharged from the reflow furnace after going through a pre-heating step, a reflow step, and a cooling step which are not illustrated. Also, in the present embodiment, because an active metal such as titanium is not included in the electro-conductive metal paste 30, the high heat-conductive substrate 10 is not required to be baked under a vacuum environment, and can be baked using a device that is used under an atmospheric environment, the device being of lower cost compared to a high vacuum furnace. Further, the heating condition is properly set according to the kind of the high heat-conductive substrate 10, the kind of the electro-conductive metal paste 30, and so on. As the heating condition, when the electro-conductive metal paste 30 is a paste including an Ag—Sn-based alloy for example, setting to approximately 860° C. can be cited. By doing so, solvent, binder and the like included in the electro-conductive metal paste 30 can be vaporized/removed.

Here, because the high heat-conductive substrate 10 is formed of a non-oxide-based ceramic material such as AlN, the high heat-conductive substrate 10 does not basically adhere to the electro-conductive metal paste 30 (the electro-conductive metal section 30S) of an Ag—Sn-based alloy and the like. However, in the present embodiment, because the holding layer 20 is formed on the wall surface 11a of the through hole 11 in the step of FIG. 3C, predetermined atoms included in the holding layer 20 and predetermined atoms in the electro-conductive metal paste 30 are combined to each other to form a chemical compound. For example, an oxygen atom (O) included in the holding layer 20 and Sn for example included in the electro-conductive metal paste 30 are combined to each other to form tin oxide (SnO). Because a tight interface by inter-atom bonding of the chemical compound (SnO) thus formed is formed, the electro-conductive metal section 30S is adhered (bonded) to the high heat-conductive substrate 10, and is held within the through hole 11.

Figure 3F:
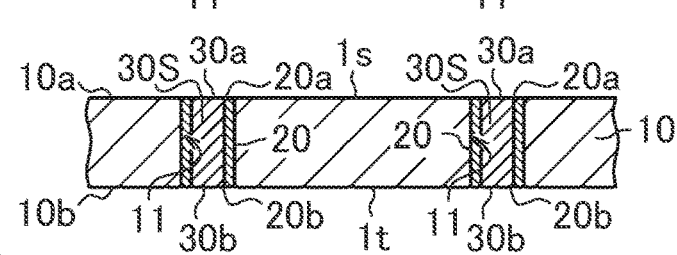

FIG. 3F shows the polishing step S6 that is shown in FIG. 2. In the polishing step S6, one side surface (a front side surface 10a) and the other side surface (a back side surface 10b) of the high heat-conductive substrate 10 including the electro-conductive metal section 30S are polished. Also, in the polishing step S6, end surfaces 20a and 20b of the holding layer 20 and end surfaces 30a and 30b of the electro-conductive metal section 30S held inside the through hole 11 by the holding layer 20 are exposed to the front side surface 10a and the back side surface 10b of the high heat-conductive substrate 10 respectively (are preferably polished so as to become smooth). In the polishing step S6, mechanical polishing is executed in both front and back surfaces of the high heat-conductive substrate 10. Also, in the polishing step S6, for example, after executing rough grinding of both of the front and back surfaces of the high heat-conductive substrate 10 having been baked before, polishing is executed for finishing the front side surface 10a and the back side surface 10b of the high heat-conductive substrate 10 (the holding layer 20 and the electro-conductive metal section 30S) having been ground to become smooth. Further, this polishing step S6 is executed to such degree that the holding layer 20 having been shielded by the surfaces (the front side surface 10a and the back side surface 10b) of the high heat-conductive substrate 10 is removed and the high heat-conductive substrate 10 is exposed. Also, in the polishing step S6, as the grinding agent, powder of the diamond slurry, the alumina slurry, and the like for example is used.

By this polishing step S6, as shown in FIG. 3F, a smooth surface 1s is formed which includes the front side surface 10a of the high heat-conductive substrate 10, the end surface 20a of one end side of the holding layer 20, and the end surface 30a of one end side of the electro-conductive metal section 30S. In a similar manner, by this polishing step S6, as shown in FIG. 3F, a smooth surface 1t is formed which includes the back side surface 10b of the high heat-conductive substrate 10, the end surface 20b of the other end side of the holding layer 20, and the end surface 30b of the other end side of the electro-conductive metal section 30S.

Figure 3G:
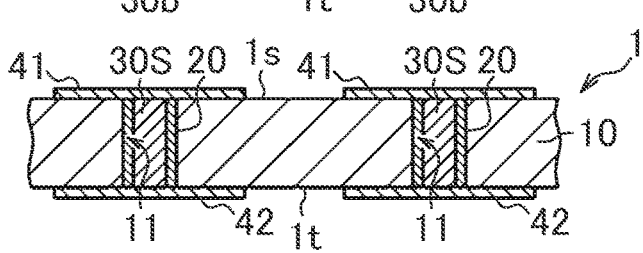

FIG. 3G shows the electrode shielding step S7 that is shown in FIG. 2. In the electrode shielding step S7, thin film metallization is executed. That is to say, in this step, after the polishing step S6, the end surfaces 20a, 20b of the holding layer 20 and the end surfaces 30a, 30b of the electro-conductive metal section 30S having been exposed are shielded by the electrodes (the thin film electrodes 41 and 42). To be more specific, the end surface 30a of one end side of the electro-conductive metal section 30S exposed to the smooth surface 1s of the front side of the high heat-conductive substrate 10 is shielded by the thin film electrode 41 along with the end surface 20a of one end side of the holding layer 20 and a part of the front side surface 10a of the high heat-conductive substrate 10. Also, the end surface 30b of the other end side of the electro-conductive metal section 30S exposed to the smooth surface 1t of the back side is shielded by the thin film electrode 42 along with the end surface 20b of the other end side of the holding layer 20 and a part of the back side surface 10b of the high heat-conductive substrate 10. The thin film electrodes 41 and 42 are formed of 3 layers of a titanium thin film, a platinum thin film, and a gold thin film for example as described above. Thus, the thin film electrode 41 of the front side and the thin film electrode 42 of the back side can be made conductive to each other through the electro-conductive metal section 30S that is formed in the through hole 11. Also, known methods that can execute thin film metallization can be applied to the electrode shielding step S7.

Next, referring to FIGS. 4A to 4G, an aspect of piercing by the piercing step S2 will be explained for a case of non-penetrated through hole 11 (a non-penetrated hole 12).

In the process drawings of FIGS. 4A to 4G, the process is executed in the order of 4A→4B→4C→4D→4E→4F→4G.

Figure 4A:
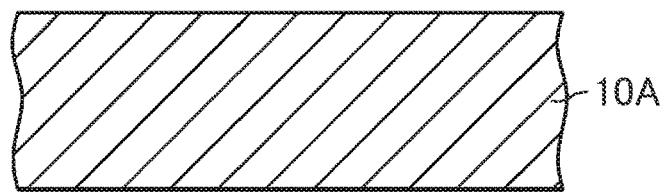
FIGS. 4A to 4G are process drawings that show another aspect of the method for manufacturing the double-sided circuit non-oxide-based ceramic substrate related to the present embodiment.

FIG. 4A shows the substrate baking step S1 that is shown in FIG. 2. The substrate baking step S1 can be executed similarly to the explanation that was made referring to FIG. 3A, and a high heat-conductive substrate 10A is thereby manufactured.

Figure 4B:
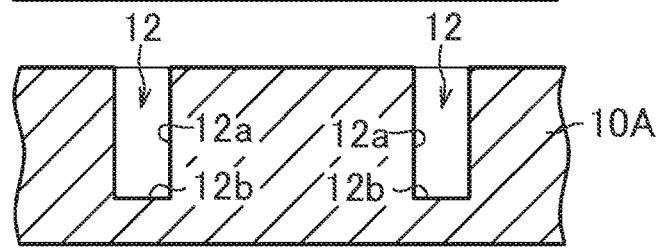

FIG. 4B shows the piercing step S2 that is shown in FIG. 2. In the piercing step S2, the non-penetrated hole 12 is formed in the high heat-conductive substrate 10A. The non-penetrated hole 12 is formed by laser machining and blast machining. In the laser machining, by controlling the output (W) and the irradiation time, the hole 12 is formed which has a peripheral surface (side surface) 12a and a bottom surface 12b and not penetrates to the back side surface 10b (refer to FIG. 4F) of the high heat-conductive substrate 10A. Also, by applying the laser machining, the diameter of the non-penetrated hole 12 can be made small, and the diameter of the non-penetrated hole 12 can be formed to be equal from the opening to the bottom. On the other hand, as the blast machining, shot blast, sand blast, and the like can be applied. Also, as shown in FIG. 4B, when piercing is executed by this aspect, because it is not required to penetrate the hole, the dummy plate 100 that was required in FIG. 3B can be made unnecessary, and the cost incurred in manufacturing can be reduced.

Figure 4C:
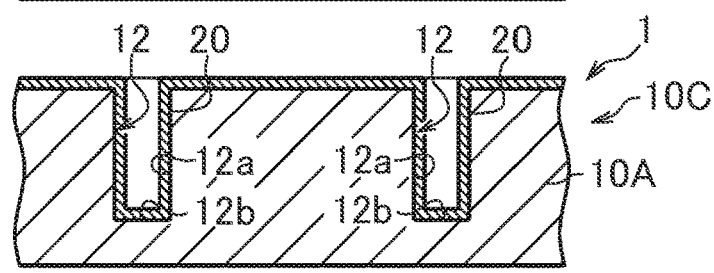

FIG. 4C shows the holding layer forming step S3 that is shown in FIG. 2. By executing this holding layer forming step S3, the double-sided circuit substrate 1 related to the intermediate material 10C can be manufactured. The holding layer forming step S3 can be executed similarly to the explanation that was made referring to FIG. 3C. However, in this holding layer forming step S3, the holding layer 20 is formed on the peripheral surface 12a and the bottom surface 12b of the non-penetrated hole 12. Also, since the bottom surface 12b is to be removed by the polishing step S6 described below, it is also possible to be configured that the holding layer 20 is formed only on the peripheral surface 12a excluding the bottom surface 12b.

Figure 4D:
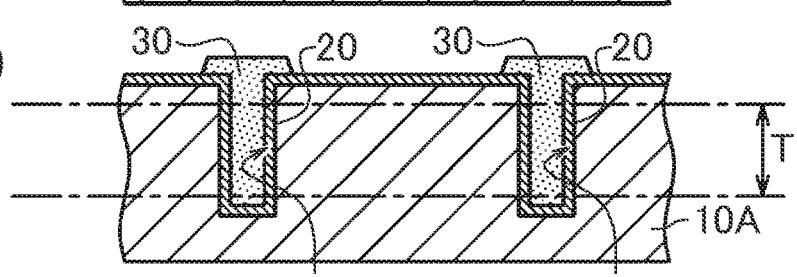

FIG. 4D shows the filling step S4 that is shown in FIG. 2. The filling step S4 can be executed similarly to the explanation that was made referring to FIG. 3D. However, in an example shown in FIG. 4D, the non-penetrated hole 12 is formed. Accordingly, because fitting of the mesh-shape member from the opposite side of the hole and the suction device as explained in FIG. 3D are not required, the cost incurred in manufacturing can be reduced. Also, in an example shown in FIG. 4D, since the electro-conductive metal paste 30 does not leak from the opposite side of the non-penetrated hole 12, it is easier to fill the non-penetrated hole 12 with the electro-conductive metal paste 30. Further, in an example shown in FIG. 4D, the filling step S4 can be executed quickly by ordinary screen printing that does not use the mesh and the suction device. Also, a range T shown by a single dot chain line in FIG. 4D shows a range used as the product.

Figure 4E:
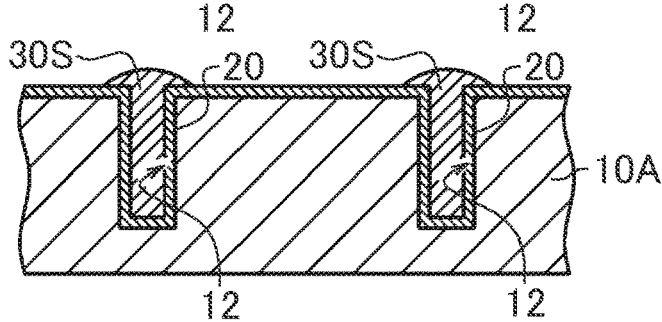

FIG. 4E shows the electro-conductive metal section forming step S5 that is shown in FIG. 2. The electro-conductive metal section forming step S5 can be executed similarly to the explanation that was made referring to FIG. 3E.

Figure 4F:
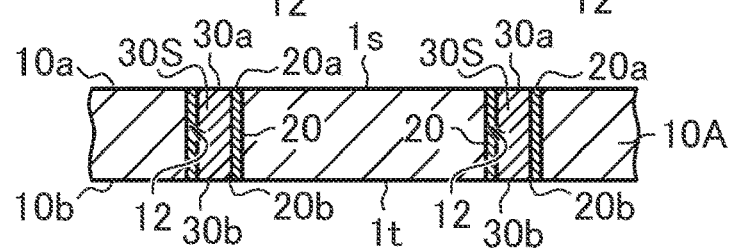

FIG. 4F shows the polishing step S6 that is shown in FIG. 2. In the polishing step S6, similarly to the explanation that was made referring to FIG. 3F, the front side surface 10a and the back side surface 10b of the high heat-conductive substrate 10A including the electro-conductive metal section 30S are polished. However, here, with respect to the back side surface 10b where the non-penetrated hole 12 is not formed, the high heat-conductive substrate 10A is polished until the electro-conductive metal section 30S is exposed. In the polishing step S6, after executing rough grinding of both of the front and back surfaces of the high heat-conductive substrate 10A, polishing is executed for finishing the front side surface 10a and the back side surface 10b of the high heat-conductive substrate 10A (including the holding layer 20 and the electro-conductive metal section 30S) having been ground to become smooth. Also, this polishing step S6 is executed until the holding layer 20 shielding the surface (the front side surface 10a and the back side surface 10b) of the high heat-conductive substrate 10A is removed and the surface of the high heat-conductive substrate 10A is exposed in the front side surface 10a, and until the electro-conductive metal section 30S is exposed in the back side surface 10b.

By this polishing step S6, as shown in FIG. 4F, the smooth surface 1s is formed which includes the front side surface 10a of the high heat-conductive substrate 10A, the end surface 20a of one end side of the holding layer 20, and the end surface 30a of one end side of the electro-conductive metal section 30S. In a similar manner, by this polishing step S6, as shown in FIG. 4F, the smooth surface 1t is formed which includes the back side surface 10b of the high heat-conductive substrate 10A, the end surface 20b of the other end side of the holding layer 20, and the end surface 30b of the other end side of the electro-conductive metal section 30S.

Figure 4G:
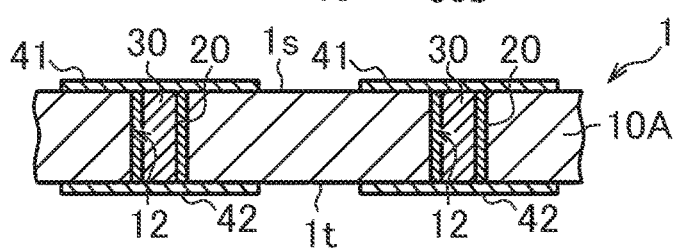

FIG. 4G shows the electrode shielding step S7 that is shown in FIG. 2. The electrode shielding step S7 can be executed similarly to the explanation that was made referring to FIG. 3G.

According to the method for manufacturing the double-sided circuit substrate 1 shown in FIGS. 4A to 4G, since the dummy sheet 100 (refer to FIG. 3B) is not required in the step for piercing the non-penetrated hole 12 shown in FIG. 4B, the cost incurred in manufacturing can be reduced. Also, in the manufacturing method shown in FIGS. 4A to 4G, since the electro-conductive metal paste 30 does not leak from the opposite side of the non-penetrated hole 12, it is easier to fill the non-penetrated hole 12 with the electro-conductive metal paste 30. Further, in the manufacturing method shown in FIGS. 4A to 4G, the filling step S4 can be executed quickly by ordinary screen printing that does not use the mesh and the suction device.

By both of the contents shown in FIGS. 3A to 3G and the contents shown in FIGS. 4A to 4G, the double-sided circuit substrate 1 related to the present embodiment can be manufactured properly. The double-sided circuit substrate 1 includes the high heat-conductive substrate 10 (10A) having the through hole 11, the holding layer 20 formed on the wall surface 11a of the through hole 11, and the electro-conductive metal section 30S held inside the through hole 11 by the holding layer 20.

Also, the double-sided circuit substrate 1 has excellent radiation property because the high heat-conductive substrate 10 (10A) is formed using the high heat-conductive non-oxide-based ceramic material. Further, the double-sided circuit substrate 1 can rigidly hold the electro-conductive metal section 30S within the through hole 11 by arranging the holding layer 20 in the through hole 11. Since this electro-conductive metal section 30S does not include an active metal, it is not required to be baked under a vacuum environment using a high vacuum furnace and the like in the manufacturing step, and the electro-conductive metal section 30S can be manufactured at a low cost.

Also, according to the present embodiment, there are provided the smooth surfaces 1s, 1t which are obtained by polishing the end surfaces 30a, 30b of both ends of the electro-conductive metal section 30S and the end surfaces 20a, 20b of both ends of the holding layer 20, and the electro-conductive metal section 30S exposed to the smooth surfaces 1s, 1t is shielded by the thin film electrodes 41 and 42 (refer to FIG. 1, FIG. 3G, and FIG. 4G). Thus, by forming the smooth surfaces 1s, 1t, the double-sided circuit substrate 1 can be used as a ceramic substrate for double-sided mounting. Particularly, the double-sided circuit substrate 1 can be used properly for a high power laser device.

The present invention is not limited to the embodiments described above, and various modifications are further included. For example, although explanation was made exemplifying the high heat-conductive substrate 10 and 10A for double-sided mounting in the embodiments described above, it may also be configured to use the double-sided circuit substrate 1 in a multi-layered style.

LIST OF REFERENCE SIGNS

1 Double-sided circuit substrate (double-sided circuit non-oxide-based ceramic substrate)
1s, 1t Smooth surface
10, 10A High heat-conductive substrate (high heat-conductive non-oxide-based ceramic substrate)
11 Through hole (penetrated hole)
12 Non-penetrated hole
11a Wall surface
12a Peripheral surface (wall surface)
12b Bottom surface
20 Holding layer
30 Electro-conductive metal paste
30S Electro-conductive metal section
41, 42 Thin film electrode (electrode)

The invention claimed is:

1. A method for manufacturing a double-sided circuit non-oxide-based ceramic substrate, comprising:
    baking a high heat-conductive non-oxide-based ceramic material into a sheet shape to provide a high heat-conductive non-oxide-based ceramic substrate;
    piercing a predetermined position of the ceramic substrate to provide a penetrated or non-penetrated through hole; and
    forming a holding layer at least on a wall surface of the through hole by oxide of silicon or alumina.

2. The method for manufacturing a double-sided circuit non-oxide-based ceramic substrate according to claim 1, further comprising:
    filling the through hole with an electro-conductive metal paste after the forming, the electro-conductive metal paste not including an active metal, the holding layer being formed in the through hole;
    baking the ceramic substrate to make the electro-conductive metal paste into an electro-conductive metal section after the filling; and
    polishing one side surface and the other side surface of the ceramic substrate that includes the electro-conductive metal section, to provide an exposed end surface of the holding layer and an exposed end surface of the electro-conductive metal section that is held inside the through hole by the holding layer to one side surface and the other side surface of the ceramic substrate respectively.

3. The method for manufacturing a double-sided circuit non-oxide-based ceramic substrate according to claim 2, further comprising:
    shielding the exposed end surface of the holding layer and the end exposed surface of the electro-conductive metal section after the polishing.

* * * * *